United States Patent [19]

Sakurada et al.

[11] Patent Number: 5,345,574
[45] Date of Patent: Sep. 6, 1994

[54] MEMORY CARD HAVING CONTROLLER PROVIDING ADJUSTABLE REFRESH TO A PLURALITY OF DRAMS

[75] Inventors: Noriaki Sakurada; Fujikazu Sugimoto; Ichiro Kobayashi, all of Suwa, Japan

[73] Assignee: Seiko Epson Corporation, Tokyo, Japan

[21] Appl. No.: 708,730

[22] Filed: May 15, 1991

[30] Foreign Application Priority Data

| May 15, 1990 | [JP] | Japan | 2-124753 |
| May 16, 1990 | [JP] | Japan | 2-126143 |
| May 23, 1990 | [JP] | Japan | 2-133223 |
| May 29, 1990 | [JP] | Japan | 2-138974 |
| Apr. 12, 1991 | [JP] | Japan | 3-80169 |

[51] Int. Cl.$^5$ ............................................. G06F 12/00
[52] U.S. Cl. ............................... 395/425; 364/DIG. 1; 364/DIG. 2; 364/964; 365/222
[58] Field of Search ... 364/200 MS File, 900 MS File; 365/222; 395/425

[56] References Cited

U.S. PATENT DOCUMENTS

| 4,393,477 | 7/1983 | Murotani | 365/222 |
| 4,631,701 | 12/1986 | Kappeler et al. | 395/425 |
| 4,725,945 | 2/1988 | Kronstadt et al. | 395/425 |
| 4,796,232 | 1/1989 | House | 365/189.03 |
| 4,901,283 | 2/1990 | Hanbury et al. | 365/222 |
| 4,933,907 | 6/1990 | Kumanoya et al. | 365/222 |
| 4,943,960 | 7/1990 | Komatsu et al. | 365/222 |
| 4,958,322 | 9/1990 | Kosugi et al. | 365/189.01 |
| 4,967,397 | 10/1990 | Walck | 365/222 |
| 4,977,537 | 12/1990 | Dias et al. | 395/425 |
| 4,984,209 | 1/1991 | Rajaram et al. | 365/222 |
| 4,985,868 | 1/1991 | Nakano et al. | 365/222 |
| 4,989,183 | 1/1991 | Kumanoya et al. | 365/222 |
| 5,122,988 | 6/1992 | Graeve | 365/219 |
| 5,146,592 | 9/1992 | Pfeiffer et al. | 395/157 |
| 5,148,535 | 9/1992 | Ballard | 395/425 |
| 5,153,856 | 10/1992 | Takahashi | 365/233 |
| 5,172,341 | 12/1992 | Amin | 365/222 |
| 5,179,667 | 1/1993 | Iyer | 395/275 |
| 5,195,182 | 3/1993 | Sasson | 395/250 |
| 5,197,026 | 3/1993 | Butler | 365/104 |

FOREIGN PATENT DOCUMENTS 0338528 10/1989 European Pat. Off. .
0352768 1/1990 European Pat. Off. .

OTHER PUBLICATIONS

Motorola, Semiconductor Application Note, AN987 Entitled "DRAM Refresh Modes," Memory Device Data, DL113/D, Rev. 1991, pp. 10–6 to 10–7.

Primary Examiner—Joseph L. Dixon
Assistant Examiner—Matthew Kim
Attorney, Agent, or Firm—Eric B. Janofsky

[57] ABSTRACT

A dynamic access random access card is provided with a dynamic random access memory and a source for generating a plurality of reference clock pulses. A control circuit generates refresh operations of the dynamic access memory in response to the plurality of reference clock pulses generated by the source, the initiation of the refresh operations being independent of any external refresh request. The refresh operations are interrupted and the dynamic random access memory is set to a standby condition upon detection of a predetermined external signal, thereby permitting read/write operations of the dynamic random access memory.

6 Claims, 7 Drawing Sheets

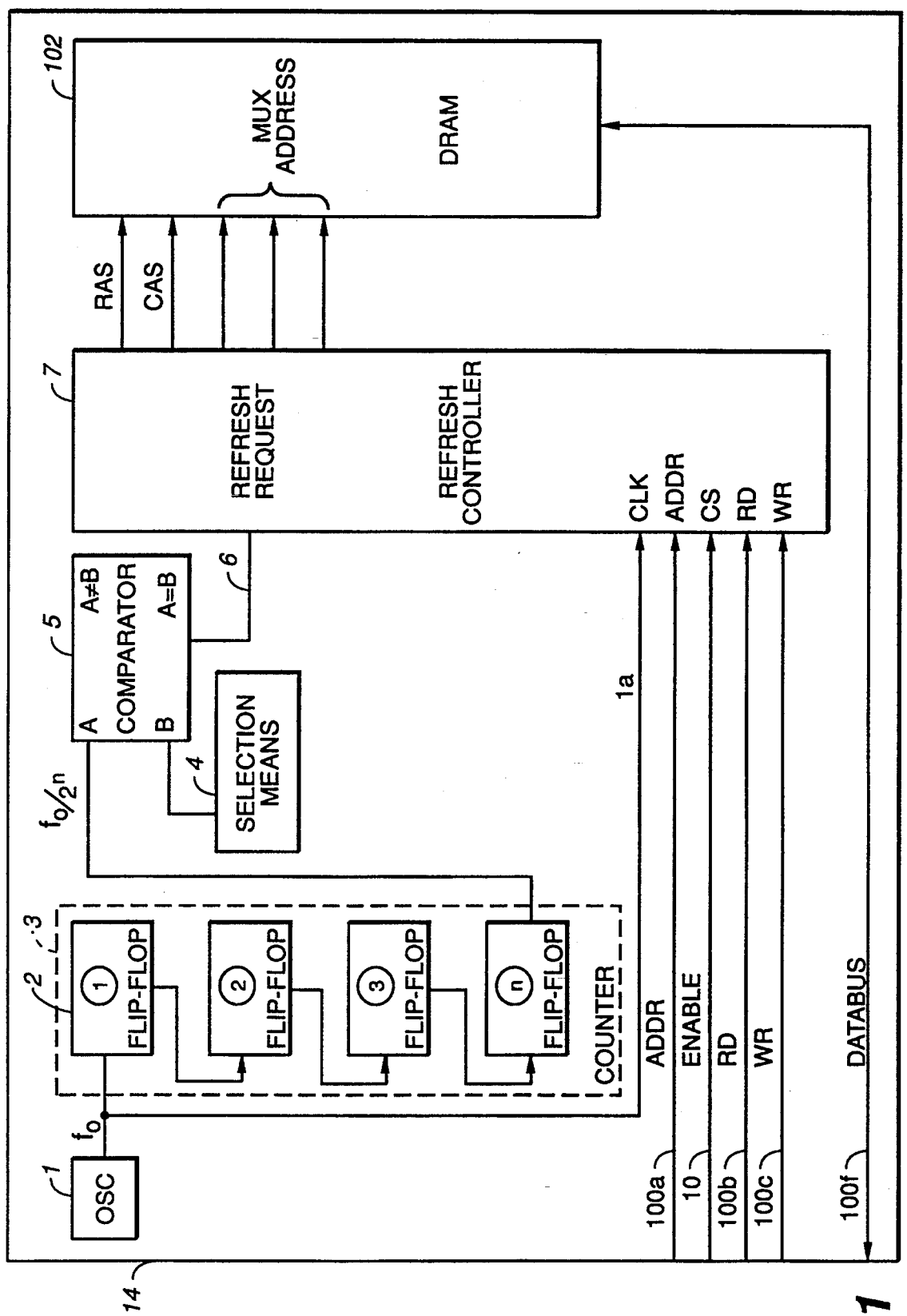
FIG._1

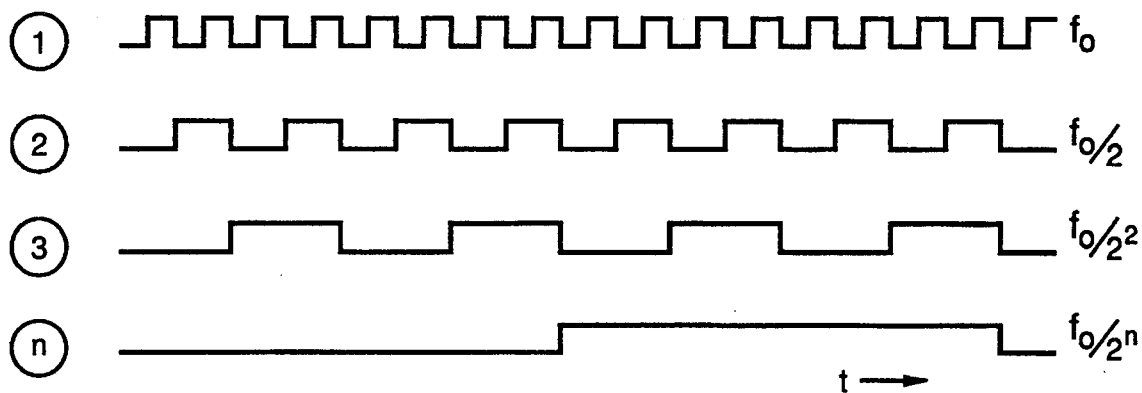
FIG._2
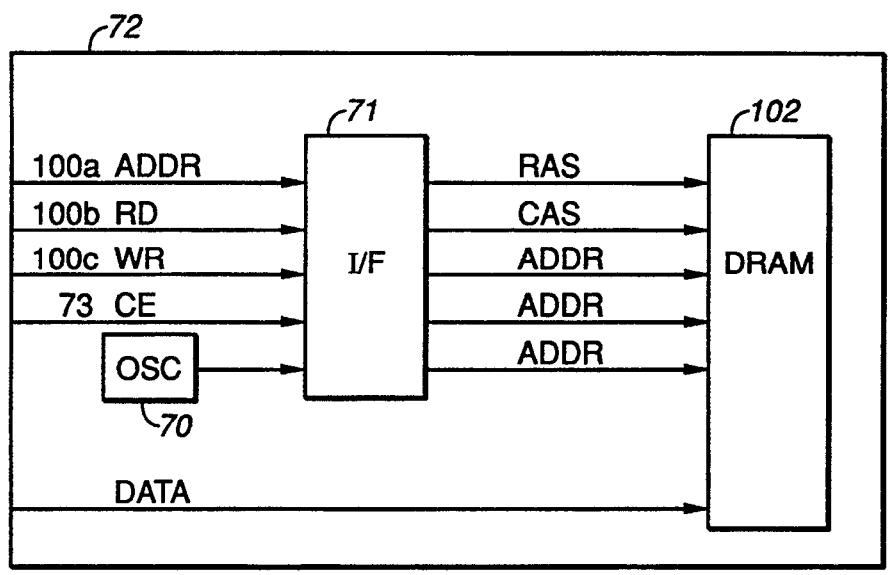
FIG._7
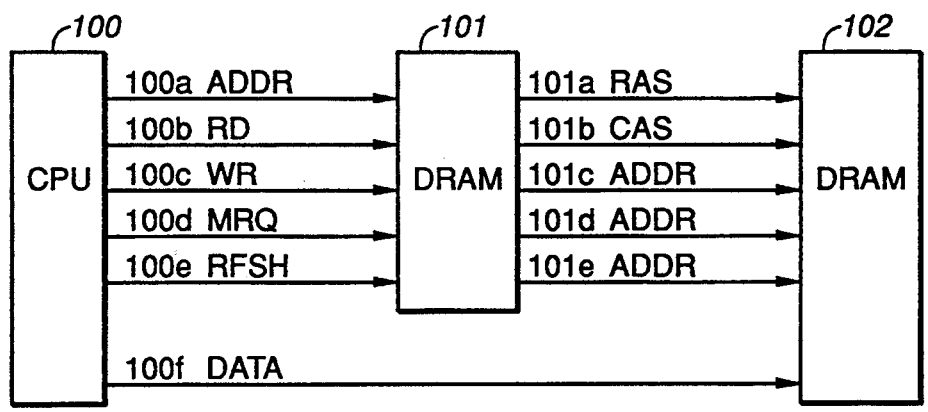
FIG._10 (PRIOR ART)

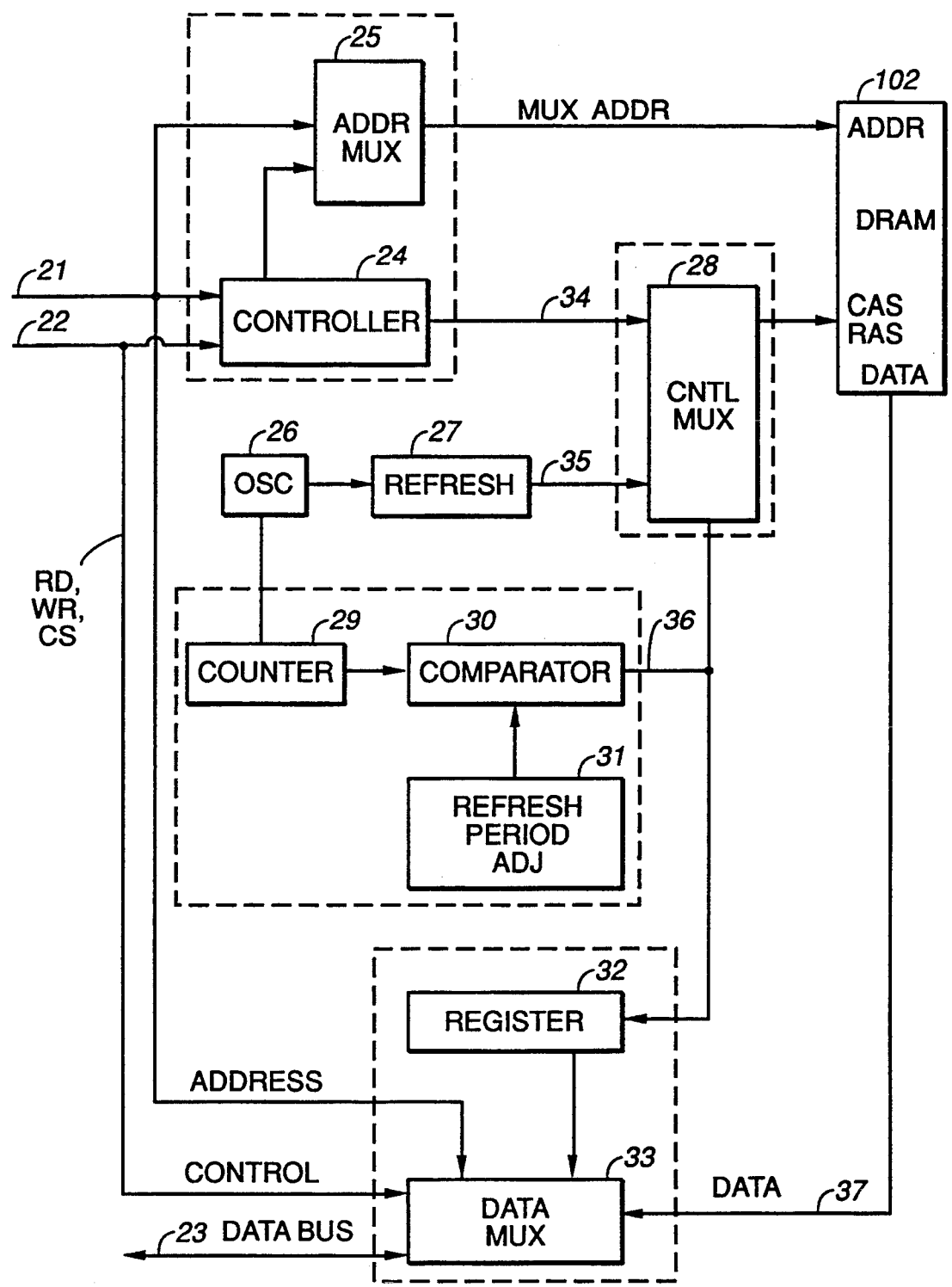
FIG._3

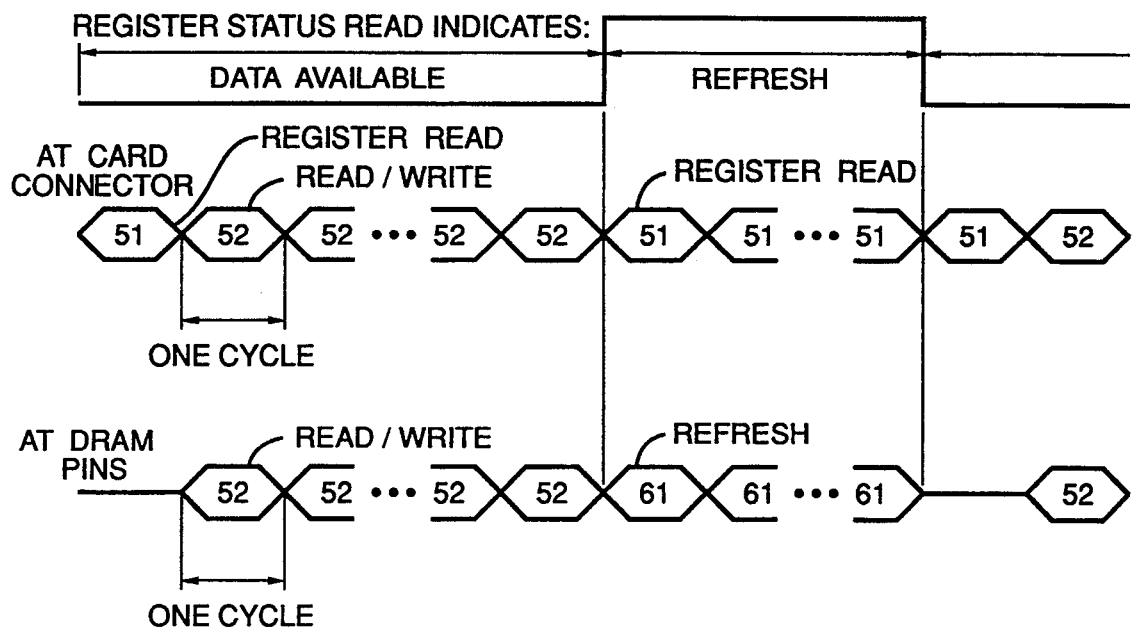
FIG._4
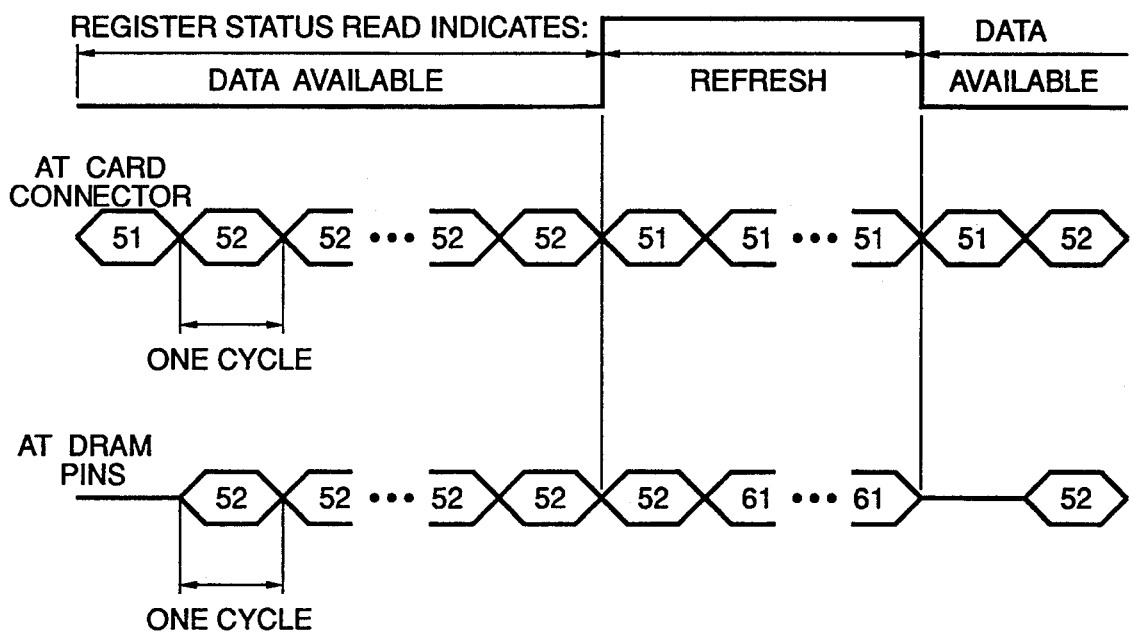
FIG._6

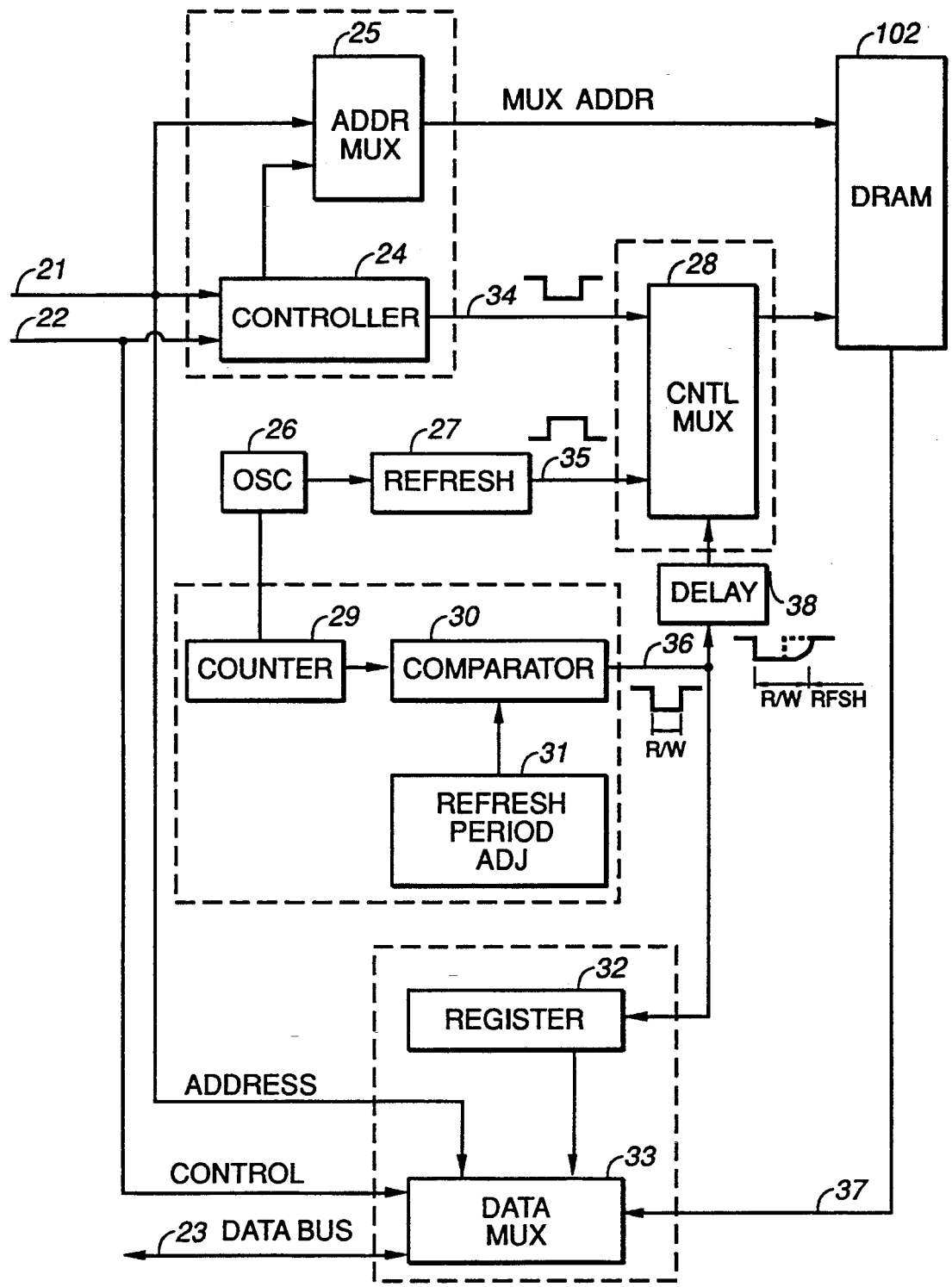
FIG._5

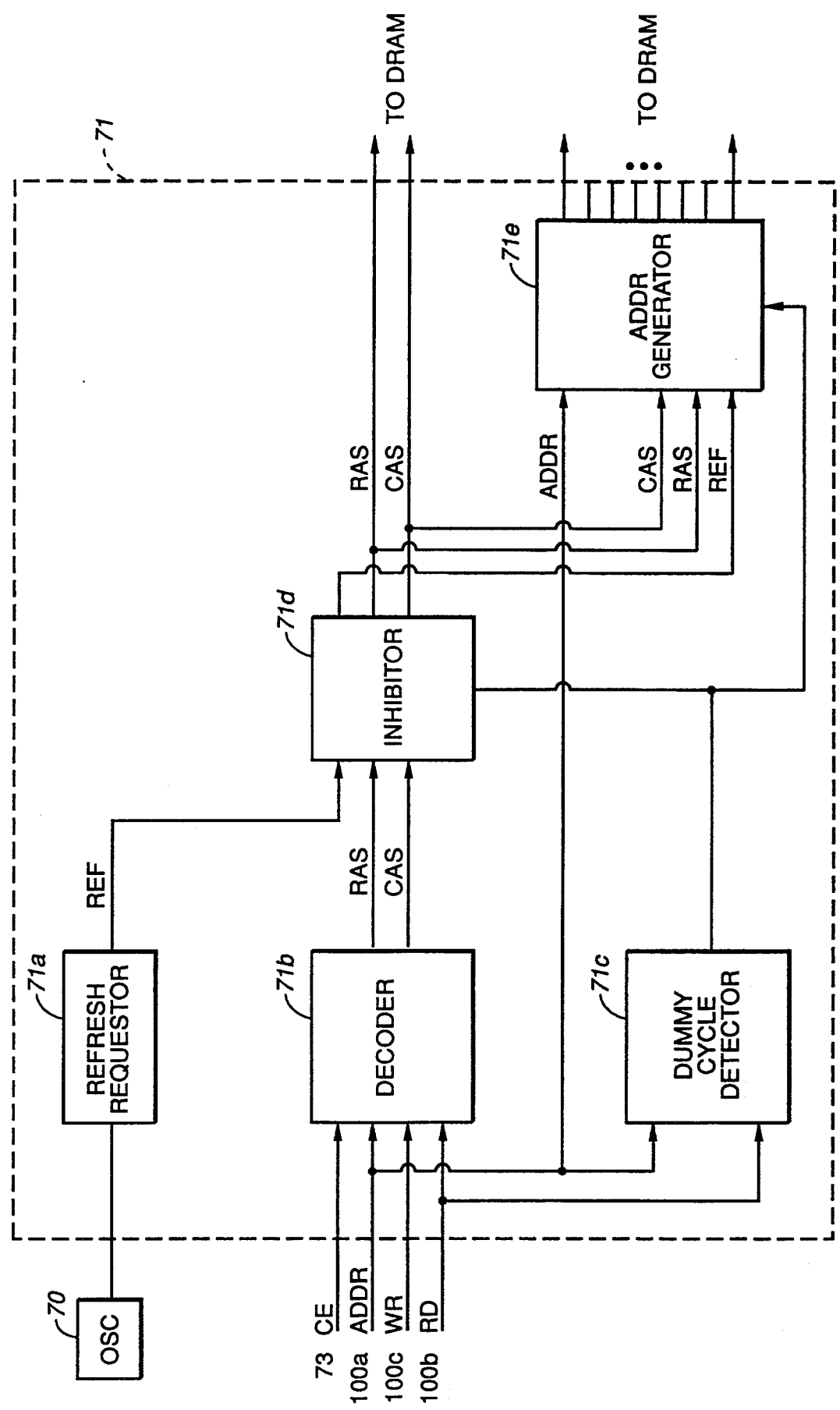
FIG._8

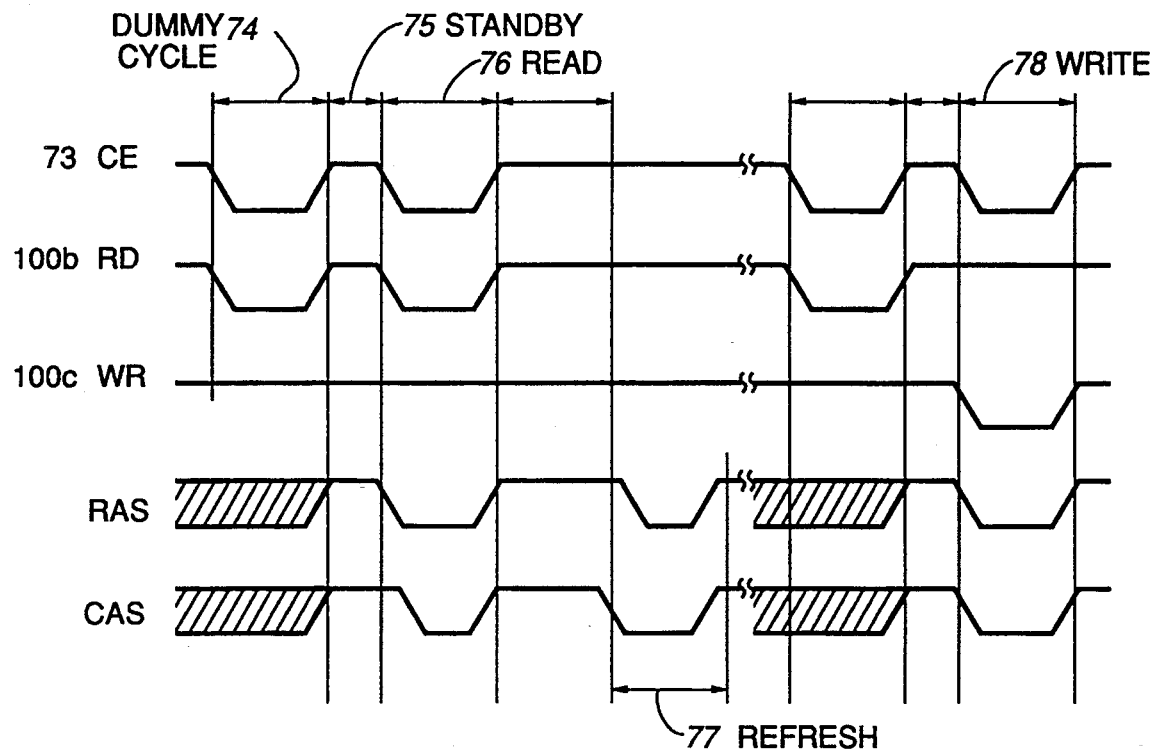
FIG._9 (PRIOR ART)
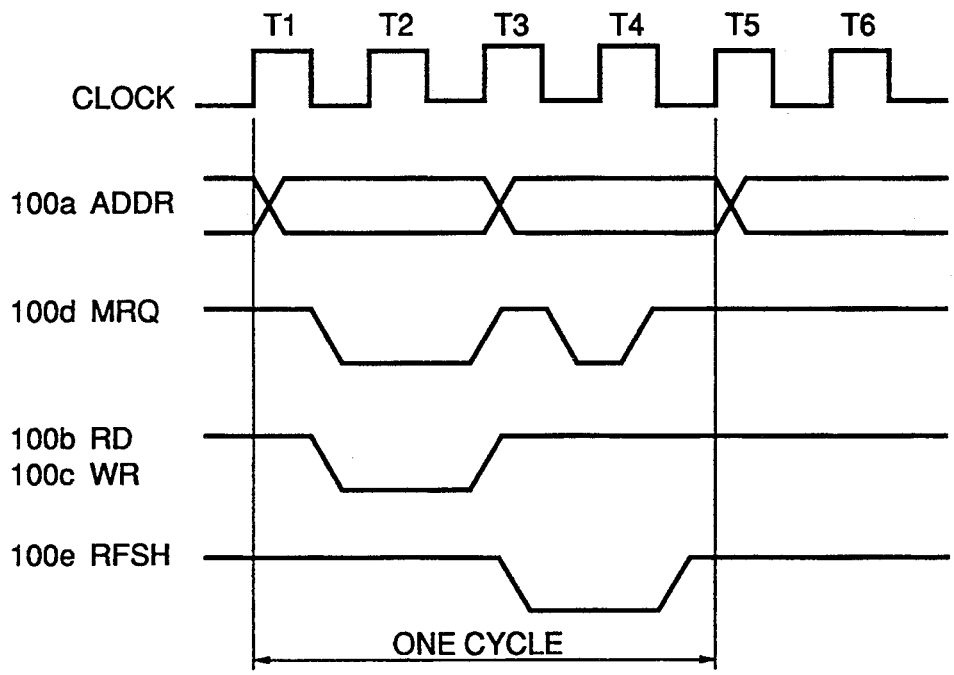
FIG._11 (PRIOR ART)

MEMORY CARD HAVING CONTROLLER PROVIDING ADJUSTABLE REFRESH TO A PLURALITY OF DRAMS

BACKGROUND OF THE INVENTION

The invention relates generally to computer semiconductor memory cards based on dynamic random access memory (DRAM) devices and which consequently involve DRAM refresh operations, and in particular this invention relates to devices and methods that provide for refreshing of the DRAM devices on plug-in boards in an automatic way that is self-contained on the memory card and optimum for whatever type of DRAM devices are being used.

The use of DRAMs for main memory and for expansion board memory is conventional in personal computer systems. The fact that DRAM-type memories need outside stimulus to "refresh" their individual memory cells periodically is well-known to those skilled in the art. See, "DRAM Refresh Modes," Motorola Semiconductor Application Note AN987, *Motorola Memory Data*, rev. 6, 1990, pp.13-2 to 13-3. DRAMs have also traditionally only been offered in 16, 18, or 20-pin DIP packages and do not have enough pins to directly address the million or so bits of information inside. So the addresses have been traditionally multiplexed onto an address bus to reduce the number of address pins in the order of 50%. The outside interface to the DRAM must then split system addresses in half and send then along the same bus. Half those addresses are strobed into DRAM registers with a "RAS" signal and the other half with a "CAS" signal. The RAS and CAS must be generated by the DRAM interface circuitry. But even though external DRAM interface and refresh circuitry typically adds cost and inserts refresh cycles that can interfere with and slow down system access, DRAM memories nevertheless compare very favorably with other types of devices on many different scores.

FIG. 10 illustrates a common prior art interfacing of a computer with DRAM. A central processing unit (CPU) 100 sends a plurality of signals to a DRAM interface 101 which, in turn, modifies these signals and applies them to DRAM 102. The CPU 100 signals include address 100a, read control (RD) 100b, write control (WR) 100c, memory request (MRQ) 100d, and refresh control (RFSH) 100e. Databus 100f exchanges data bidirectionally and directly between CPU 100 and DRAM 102. CPU 100 must issue periodic DRAM refresh cycles so that data at addresses within DRAM 102 do not spoil. Normal data transfers are suspended during such refresh cycles. The required period of refresh cycles depends on the actual type of DRAM device being employed in DRAM 102.

DRAM interface 101 provides row address strobe (RAS) 101a, column address strobe (CAS) 101b, and multiplexed addresses 101c, 101d, and 101e. DRAM interface circuit 101 outputs RAS 101a, CAS 101b and address signals 101c, 101d and 101e, based on the particular states of address 100a and control signals RD 100b, WR 100c, and MRQ 100d. (The control signals are all low true, as is the custom in such designs, but the signal names are not shown as $\overline{RD}$, $\overline{WR}$, $\overline{MRQ}$, etc., for the sake of simplicity.) During refresh operations, RAS 101a, CAS 101b and addresses 101c, 101d and 101e are periodically output in a sequence to DRAM 102 to retain data stored in the DRAM 102. (DRAM memory cells will be refreshed if simply addressed.)

FIG. 11 shows a generalized timing that is applicable to the circuit of FIG. 10. To access DRAM 102, CPU outputs address 100a, MRQ 100d goes low, and either RD 100b or WR 100c go low. DRAM interface circuit 101 multiplexes the original address onto addresses 101c, 101d and 101e, and coordinates RAS 101a and CAS 101b to indicate to DRAM 102 whether the address lines currently have the row or the column half of the complete address. (Note how the negative going edges of RAS 101a and CAS 101b are skewed slightly in time.) Data is exchanged between CPU 100 (data to DRAM 102 if a write, data from DRAM 102 if a read cycle) over databus 100f with addresses in DRAM 102. A refresh generator (e.g., a software program) is built into CPU 100 that outputs refresh signal (RFSH) 100e to DRAM interface circuit 101, along with an appropriate address signal 100a and MRQ 100d. DRAM interface circuit 101 outputs RAS 101a, CAS 101b, and address 101c, 101d and 101e in order to refresh DRAM 102 and thereby retain the data stored at the various addresses in DRAM 102. The refresh operation need not be output by the CPU at completely arbitrary times. It is often preferable to output a refresh cycle at prescribed times, such as after fetching an instruction from memory.

Memory cards are a convenient way for users to add more memory to computer systems. Such cards can be plugged into sockets universally provided standard on most popular systems. Some of these prior art memory cards do not initiate their own refresh cycles. Such memory cards include only the equivalent function of DRAM 102. The individual timing of refresh signals often differs, depending on the CPU being used. For practical reasons, no CPU can always supply an optimum refresh signal to every kind of DRAM-equipped memory card, because the needs of the DRAMs themselves differ, especially when comparing larger and smaller DRAMs. Common refresh periods are 8, 16, 32, and 64 milliseconds. So if any of these four could be used, a prior art memory card would have to refresh every eight milliseconds to ensure that the memory is properly refreshed. Other prior art systems always follow a read or write operation by a refresh operation, as a result, the overall access time of the memory card is stretched out.

A memory card is needed that can automatically refresh itself with an optimum refresh period, and one able to separate data transfers from refresh operations. Such a memory card would shorten access times and improve interoperability and reliability.

SUMMARY OF THE INVENTION

According to the present invention, a memory card comprises means to generate RAS-before-CAS data access control signal timing and CAS-before-RAS refresh control signal timing, adjustable means to periodically request the means to generate to switch momentarily to refresh control timing, status indication means to inform the computer system a refresh cycle is in progress, a plurality of DRAM devices able to support CAS-before-RAS refresh cycles and in communication with the means to generate, and such that the periodic refresh request occurs at intervals optimum for the DRAM devices and is independent of any refresh requests generated by the computer system.

An advantage of the present invention is that a variety of DRAMs can be used, and whatever type is used can have the refresh period adjusted to suit its optimum interval.

Other objects and attainments together with a fuller understanding of the invention will become apparent and appreciated to those skilled in the art by referring to the following description and claims taken in conjunction with the accompanying drawings.

BRIEF DESCRIPTION OF THE DRAWINGS

FIG. 1 is a block diagram of a memory card, according to a first embodiment of the present invention;

FIG. 2 is a timing chart of the various waveforms present at the first through the "$n^{th}$" outputs of the counter in FIG. 1;

FIG. 3 is a block diagram of a memory card that is an example of a second embodiment of the present invention;

FIG. 4 is a timing chart showing the relationships between status register contents, card edge transfers, and DRAM access activity for the memory card of FIG. 3;

FIG. 5 is a block diagram of a memory card that is an example of a third embodiment of the present invention;

FIG. 6 is a timing chart showing the relationships between status register contents, card edge transfers, and DRAM access activity for the memory card of FIG. 5;

FIG. 7 is a block diagram of a memory card that is an example of a fourth embodiment of the present invention;

FIG. 8 is a timing chart showing the relationships between status register contents, card edge transfers, and DRAM access activity for the memory card of FIG. 7;

FIG. 9 is a timing chart showing access of a prior art DRAM by the CPU;

FIG. 10 is a block diagram of a memory card of the prior art; and

FIG. 11 is a timing chart showing access of the DRAM by the CPU in FIG. 10.

DESCRIPTION OF THE PREFERRED EMBODIMENTS

FIG. 1 is a block diagram of a first embodiment memory card 14 of the present invention. Memory card 14 comprises an oscillator 1, a counter 3, a selection means 4, a comparator 5 that outputs a refresh signal 6, a refresh controller 7, and a plurality of DRAMs 102. The memory card 14 has self-generated refresh capability. Oscillator 1 provides basic timing at a frequency "$f_o$". A crystal oscillator set to 300 KHz has been found to be satisfactory. (Highly accurate 300 KHz crystals are inexpensive and widely available, they are used, for example in watches.) The counter 3, selection means 4, and comparator 5 are able to produce selectable digital output periods of 8, 16, 32, and 64 milliseconds, using the oscillator 1 output as a reference. Other selectable periods could be used, but these periods match the most common refresh periods of the popular DRAM chips currently available. Refresh controller 7 comprises the circuits necessary to initiate a burst refresh of all the row addresses in DRAMs 102 using CAS-before-RAS refresh cycles each 8, 16, 32, or 64 milliseconds. DRAMs 102, for purposes of this discussion only, can be assumed to be 256K bit types organized as 64K by four bits. Twelve such devices will easily form into a memory array of 192K by 16. Counter 3, containing individual flip-flops 2, together with selection means 4, comparator 5, and refresh controller 7 can, for example, all be integrated into a single ASIC chip that has an external crystal to support oscillator 1 and a number of external jumpers connected to option programming pins to support selection means 4. Address 100a can be input to card 14 as a straight unmultiplexed 24 bit address, or it can be multiplexed in an I/O bus fashion on databus 100f. A card enable signal 10 comprises, in an exemplary embodiment, a card enable, an output enable, a pair of card address signals, and a ready (RDY). Read control 100b and write control 100c can be separate controls, as shown in FIG. 1, or can be reduced to a signal write enable (WE) used in conjunction with card enable (CE) and output enable (OE). Refresh controller 7 must output CAS and RAS signals that follow normal RAS-before-CAS timing for data read/write and CAS-before-RAS timing to initiate each row refresh. If DRAMs, such as type HM514256 are used, write enable (WE) and output enable (OE) must also be output by controller 7 to DRAMs 102. Addresses 100a are multiplexed by controller 7 onto the nine or more multiplexed addresses that must be input to DRAMs 102 that represent the column and row addresses. For such DRAM types, there will be 512 rows that need to be periodically refreshed.

The refresh of DRAMs 102 can be done in either a single burst of 512 consecutive refresh cycles (one cycle per row) every 8, 16, 32, or 64 milliseconds, or distributed over time (e.g., eight milliseconds over 512 rows=15.6 microseconds per row), or some combination of these two extremes. ("DRAM Refresh Modes," Motorola Semiconductor Application Note AN987, *Motorola Memory Data*, rev. 6, 1990, p.13-2.)

FIG. 2 shows how the successive flip-flops 2 of counter 3 divide down the clock from oscillator 1. If the clock was 300 KHz to begin with, counter 3 must divide by 2400 to yield an output squarewave having a period of eight milliseconds. For a period of sixteen milliseconds, the division is 4800, and for 32 and 64 milliseconds, the divisions are 9600 and 19,200, respectively. As shown, the output "n" has a duty cycle of 50%. Refresh will occur only during the high level output. There will be 2400 ticks of the clock from oscillator 1 during this time, and a simple divide by four will provide 600 ticks per refresh burst period, or one tick every 13.3 microseconds. Since 512 rows are contained in a typical DRAM 102, then 600 will be more than enough cycles in a burst to guarantee that all rows are refreshed in an eight millisecond period. While the output "n" of counter 3 is high, signal 6 will be high, and memory card 14 will not be available for data read/writes since it is busy with refresh. By changing counter 3, selection means 4, and comparator 5, a refresh signal 6 can be produced that has a duty cycle less that 50%, and thus will make memory card 14 more available for data transfers.

FIG. 3 provides greater detail on the ASIC memory controller chip suggested above, it is referred to here as a second embodiment of the present invention. DRAM 102 is equivalent to that described in the previous embodiment, and therefore uses the same element numbering. Address 21 and databus 23 can be separate, as shown in FIG. 3, but I/O pins can be saved if, for example, a 24-bit address were multiplexed in three bytes over the databus 23 and held in addressable latches controlled by control input 22. Control input 22 comprises RD, WR, and CE (read, write, and card enable). Additional chip or card address lines and a decoder can alternatively be added to support multiplexing the address 21 onto the databus 23. Multiplexed nine-bit addresses (typical) are supplied to DRAMs 102 by data transfer control generator 24 working in conjunction with address MUX 25. The addresses are timed to coincide with RAS and CAS and such coordination is conventional. The refresh status of the memory controller can be determined by the CPU by addressing register 32 and by then inspecting a bit corresponding to signal 36. When register 32 is properly addressed, data MUX 33 connects databus 23 to register 32. The refresh of DRAM 102 is paced by oscillator 26. Control MUX 28 will periodically shift front inputting normal RAS-before-CAS timed signals from data transfer control generator 24 to CAS-before-RAS timing from refresh control generator 27. How often refresh cycles are injected is controlled by counter 29, comparator 30, and refresh period adjustment means 31. The overall function and purpose is described above in conjunction with counter 3, selection means 4, and comparator 5. A refresh selection signal 36 will switch control MUX 28 every 8, 16, 32, or 64 milliseconds, for a duration of 4, 8, 16, or 32 milliseconds, respectively. Other durations and periods are possible, and may be preferable, and will depend in part on the particular types of devices being used for DRAMs 102.

FIG. 4 shows how a CPU can determine with a read of register 32 the refresh status to see if data is available (signal 36 low). When the status is unknown, several register read cycles 51 are made until the status returns an indication that a data read/write cycle is available. As soon as that happens, a window of opportunity opens up that will last for a predeterminable time duration, and the CPU can read data in a burst without further checking the refresh status. At the end of the opportunity, the CPU has to begin looping on the register status bit to wait for the next refresh cycle to finish. Register read cycles 51 are repeated until the fact that data is again available is indicated by register 32. The DRAM 102 cycles that correspond to the above are shown aligned in time with the card accesses by the external CPU. Refresh operation cycles 61 are shown in burst mode. Preferably, refresh cycles 61 will just be equal in number to the number of rows in DRAM 102 and bursts will be spaced apart at near the maximum time allowed by the particular DRAM devices being used. Alternatively, distributed, hidden, and write-with-CAS-before-RAS refresh timing can be used in the present invention.

A third embodiment of the present invention is shown in FIG. 5 and is configured as a memory card similar to the first and second embodiments described above and in FIG. 3. FIG. 6 is a corresponding timing chart, and is similar to FIG. 4. FIG. 5 differs from FIG. 3 in that a delay module 38 has been added between comparator 30 and control MUX 28. The effect of data transfer enable 36 on MUX 28 is skewed by delay 38. So even if the contents returned by register 32 are positive, control 34 will not be switched off until after a delay that effectively stretches the data transfer period. Immediately afterwards, refresh operations are executed automatically and the contents of register 32 will show the memory card to be ready for data transfers.

FIG. 7 is a block diagram of a fourth embodiment memory card. FIG. 8 is a detailed block diagram of interface 71 (FIG. 7). DRAM 102 is equivalent to the above embodiments. An OSC 70 has a quartz crystal and outputs a fixed period clock. An interface 71 controls DRAM 102 with address and control signals referenced to OSC 70 and a master external to the memory card. A refresh requestor 71a divides the signal from OSC 70 and periodically outputs a refresh signal (REF) to initiate a refresh cycle in corresponding DRAM 102 on memory card 72. A decoder 71b outputs a RAS and a CAS based on the address, card enable (CE) and data transfer signals (WR, RD) from outside the memory card. A dummy-cycle status indication 71c detects whether or not a RD signal together with a particular address signal from the external CPU are, in fact, indicating dummy-cycles (defined as reads of reserved, special addresses). A refresh inhibitor 71d disables the RAS and CAS output from decoder 71b from reaching DRAM 102 when a dummy-cycle is detected. A refresh signal from refresh requestor 71a is based on dummy-cycle status indication signal detected by dummy-cycle detector 71c. An address generator 71e generates a memory address based on REF signal, RAS and CAS output, without being inhibited by refresh inhibitor 71d and address signal from external CPU. The outputs of address generator 71e float (standby condition) during dummy-cycles because they are not needed by DRAM 102.

In FIG. 7, the external CPU outputs a dummy-cycle signal to interface 71 before accessing (data transfer) memory card 72. So detector 71c of interface 71 detects the dummy-cycle signal and signals refresh inhibitor 71d. Refresh requests from requestor 71a and RAS and CAS from decoder are disabled. The dummy-cycle causes address generator 71e to float its outputs. When CE signal 42 and either RD 100b or WR 100c are received from external CPU, interface 71 can do a data transfer with DRAM 102 after a fixed standby period has elapsed. Otherwise, a refresh request from refresh generator and RAS/CAS from decoder 71b are output. DRAM 102 is thereby refreshed. When CE signal 42, address signal and RD 100b, or CE signal 42, address signal and WR 100c from external CPU are input to interface 71 during refresh operation, then interface 71 gives precedence to refresh operation; i.e., any signal other than a dummy-cycle signal does not effect refresh operation. An external CPU outputs a dummy signal to the interface circuit 40 of the memory card 41 before accessing (in a read or write data transfer operation) the memory card 41. The dummy detection circuit 71c of the interface circuit 40 detects the dummy signal and the detected signal is input to the refresh inhibit circuit 71d, which immediately begins inhibiting the refresh signal generated from the refresh generation circuit 71a together with the RAS signal and CAS signal from the RAS, CAS generation circuit. When the detection signal from the dummy detection circuit 71c is input to the address generation circuit 71e, the address signal from the address generation circuit 71e goes to a floating condition. The detection signal from the dummy detection circuit 71c is temporarily output to the refresh inhibit circuit 71d and address generation circuit 71e. When the CE signal 42 and RD signal 100b or WR signal 100c from the external CPU are input to the interface circuit 71 after a fixed period in the standby condition has elapsed, then the interface circuit 71 executes read-write operation of the DRAM 102. When the CE signal 42, address signal and RD signal 100b, or CE signal 42, address signal and WR signal 100c from the external CPU are not input, then the refresh signal from the refresh generation circuit and the RAS signal and CAS signal from the RAS, CAS generation circuit 71b are output to the DRAM 102 and the DRAM 102 is refreshed. When the CE signal 42, address signal and RD signal 100b, or CE signal 42, address signal and WR signal 100c from the external CPU are input to the interface circuit 71 during refresh operation, then the interface circuit 71 gives precedence to the refresh operation; i.e., any signal other than a dummy signal does not effect refresh operation.

As described above, by means of the invention, an oscillation source is included in the memory card and refresh operation is preformed automatically, and therefore no refresh signals need to be received from outside the memory card. Also, since the timing of the refresh signal need not be considered in the interface with main unit, when the memory card is used with the interface of a different unit, read-write operation is performed according to the read-write signal from the main unit while giving precedence to the refresh operation in the memory card, whereby a memory card with broad applicability is achieved.

In addition, the read-write period and refresh period are separated in the memory card and posted externally, and therefore the memory card need only be accessed during the read-write period, thus eliminating access during the refresh period and shortening the access time of the memory card. Also, since the memory card performs refresh operation by itself, a memory card with broad applicability to various models is achieved.

Further, by delaying the read-write period in the memory card so it extends into the refresh period, read-write operation can be performed during that delay time, thus increasing the utility of the memory card.

The memory card is temporarily set to a standby mode by the input of a dummy signal from outside the memory card, and read-write operation from outside the memory card or refresh operation by the memory card itself is performed after the standby condition has elapsed, whereby refresh operation by the memory card itself and read-write operation from outside the memory card are prevented from conflicting and the memory card can be accessed with greater efficiency.

While present invention has been described in conjunction with several specific embodiments, it is evident to those skilled in art that many further alternatives, modifications and variations will be apparent in light of forgoing description. Thus, present invention described herein is intended to embrace all such alternatives, modifications, applications and variations that may fall within spirit and scope of appended claims.

What is claimed is:

1. A memory card comprising:
   means for generating a reference clock having a predetermined reference clock period;
   a dynamic random access memory;
   refresh generation means for automatically initiating periodic refresh operations of said dynamic random access memory at a predetermined frequency independent of any externally applied refresh requests, the automatic initiation commencing each integer number "n" of the predetermined reference clock period;
   means for generating dynamic random access memory row-address-strobe-before-column-address-strobe timing signals and multiplexed addresses in response to address and control signals indicating data transfer requests from an external central processing unit, wherein the means for generating dynamic random access memory row-address-strobe-before-column-address-strobe timing and multiplexed addresses comprises a first multiplexer for generating the multiplexed addresses;
   means for selecting the integer number "n" such that the predetermined frequency of the dynamic random access memory refresh operations by said refresh generation means is adjustable,
   wherein the refresh generation means comprises a counter for counting a number of pulses of the reference clock, a comparison means for comparing the counted number of pulses to the integer number "n" received from the means for selecting, and a second multiplexer for switching said dynamic random access memory between row-address-strobe-before-column-address-strobe timing and column-address-strobe-before-row-address-strobe timing when the count of the pulses counted by said counter is equal to the number "n"; and
   status indication means for indicating to the external central process unit when said refresh generation means is refreshing said dynamic random access memory.

2. The memory card of claim 1, wherein
   said refresh generation means further comprises means for setting a status bit indicating that said refresh generation means is refreshing said dynamic random access memory; and
   wherein said status indication means provides the indication to the external CPU in response to the status bit set by said refresh generation means.

3. The memory card of claim 2, further comprising:
   delay means for inserting a delay switching of said second multiplexer such that a time available for data transfer operations is extended.

4. The memory card of claim 1, wherein said status indication means comprising a third multiplexer so that the external central processing unit selectively performs one of reading/writing data to said dynamic random access memory and reading an indication from said status indication means.

5. A dynamic random access memory card comprising:
   dynamic random access memory requiring periodic refreshing to maintain stored data therein; and
   an application specific integrated circuit dynamic random access memory controller comprising,
      an input/output bus port for selectively inputting data to said dynamic random access memory from an external central processing unit and for outputting data from said dynamic random access memory to the external central processing unit,
      a multiplexed address output port and coordinated row-address-strobe and column-address-strobe controls for interfacing with said dynamic random access memory,
      an oscillator means for generating a clock signal,
      means for burst refreshing said dynamic random access memory with column-address-strobe-before-row-address-strobe control timing signals at a predetermined frequency in accordance the clock signal generated by said oscillator means,
      means for externally adjusting the predetermined frequency of the burst refreshing by said means for burst refreshing, and means for providing a status of the burst refreshing of said dynamic random access memory by said means for burst refreshing to the external central processing unit, wherein:

the clock signal generated by said oscillator means has a frequency of about 300 KHz; and the predetermined frequency of burst refresh cycles adjusted by said means for adjusting is selectable from one of 8, 16, 32, and 64 milliseconds.

6. The dynamic random access memory card of claim 5, wherein said oscillator means comprises a crystal-controlled oscillator having connections for a crystal arranged externally to said memory controller.

* * * * *

UNITED STATES PATENT AND TRADEMARK OFFICE
CERTIFICATE OF CORRECTION

PATENT NO. : 5,345,574
DATED : September 6, 1994
INVENTOR(S) : Sakurada et al.

It is certified that error appears in the above-indentified patent and that said Letters Patent is hereby corrected as shown below:

On the title page, item [21], "708,730" should be --700,730--.

Signed and Sealed this

Twenty-seventh Day of December, 1994

Attest:

BRUCE LEHMAN

*Attesting Officer*   *Commissioner of Patents and Trademarks*